US012272610B2

(12) United States Patent
Ryu

(10) Patent No.: US 12,272,610 B2
(45) Date of Patent: Apr. 8, 2025

(54) SEMICONDUCTOR PACKAGE WITH STIFFENER

(71) Applicant: Samsung Electronics Co., Ltd., Suwon-si (KR)

(72) Inventor: Hansung Ryu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 822 days.

(21) Appl. No.: 17/160,462

(22) Filed: Jan. 28, 2021

(65) Prior Publication Data
US 2022/0059420 A1 Feb. 24, 2022

(30) Foreign Application Priority Data

Aug. 18, 2020 (KR) .................. 10-2020-0103278

(51) Int. Cl.
H01L 23/053 (2006.01)
H01L 23/00 (2006.01)
H01L 23/367 (2006.01)
H01L 25/065 (2023.01)

(52) U.S. Cl.
CPC ........ *H01L 23/053* (2013.01); *H01L 23/3672* (2013.01); *H01L 23/562* (2013.01); *H01L 25/0655* (2013.01)

(58) Field of Classification Search
CPC . H01L 23/053; H01L 23/3672; H01L 23/562; H01L 23/10; H01L 23/32; H01L 25/0655; H01L 25/0657
See application file for complete search history.

(56) References Cited

U.S. PATENT DOCUMENTS

| 5,566,448 | A | * | 10/1996 | Bhatt | .................. H01L 23/5385 |
| | | | | | 29/852 |
| 7,102,228 | B2 | | 9/2006 | Kanda | |
| 7,352,062 | B2 | | 4/2008 | Joshi et al. | |
| 8,014,154 | B2 | | 9/2011 | Lee | |
| 8,217,500 | B1 | * | 7/2012 | Hool | .................. H01L 23/49838 |
| | | | | | 257/E21.511 |
| 8,642,445 | B2 | | 2/2014 | Chen et al. | |
| 9,867,282 | B2 | | 1/2018 | Hu et al. | |
| 10,468,318 | B2 | | 11/2019 | Ahmad et al. | |
| 10,629,545 | B2 | | 4/2020 | Huang et al. | |
| 2003/0000736 | A1 | * | 1/2003 | Sathe | .................... H01L 23/562 |
| | | | | | 257/E23.068 |
| 2003/0230800 | A1 | * | 12/2003 | Akai | .................. H01L 23/3128 |
| | | | | | 257/E23.101 |
| 2005/0062143 | A1 | * | 3/2005 | Joshi | ....................... H01L 23/36 |
| | | | | | 257/E23.101 |
| 2010/0276799 | A1 | * | 11/2010 | Heng | ...................... H01L 23/36 |
| | | | | | 438/118 |
| 2012/0182694 | A1 | * | 7/2012 | Lin | ......................... H01L 23/16 |
| | | | | | 361/728 |
| 2015/0049441 | A1 | * | 2/2015 | Hu | .......................... H01L 23/13 |
| | | | | | 174/250 |

(Continued)

Primary Examiner — Shaun M Campbell
Assistant Examiner — Teresa M. Arroyo
(74) Attorney, Agent, or Firm — Fish & Richardson P.C.

(57) ABSTRACT

A semiconductor package includes a substrate, a semiconductor stack mounted on the substrate, and a stiffener surrounding the semiconductor stack, the stiffener having an octagonal shape at an edge of an upper surface thereof. A minimum distance from one angular point of an upper surface of the substrate to the stiffener is determined based on the thickness of the substrate.

18 Claims, 13 Drawing Sheets

(56) References Cited

U.S. PATENT DOCUMENTS

| | | |
|---|---|---|
| 2018/0233459 A1 | 8/2018 | Fushimi |
| 2018/0261528 A1* | 9/2018 | Chen ................. H01L 23/36 |
| 2019/0006294 A1* | 1/2019 | Ong ................. H01L 24/17 |
| 2019/0237371 A1* | 8/2019 | Ahmad ............. H01L 23/16 |
| 2021/0225729 A1* | 7/2021 | Bozorg-Grayeli ...... H01L 23/16 |

* cited by examiner

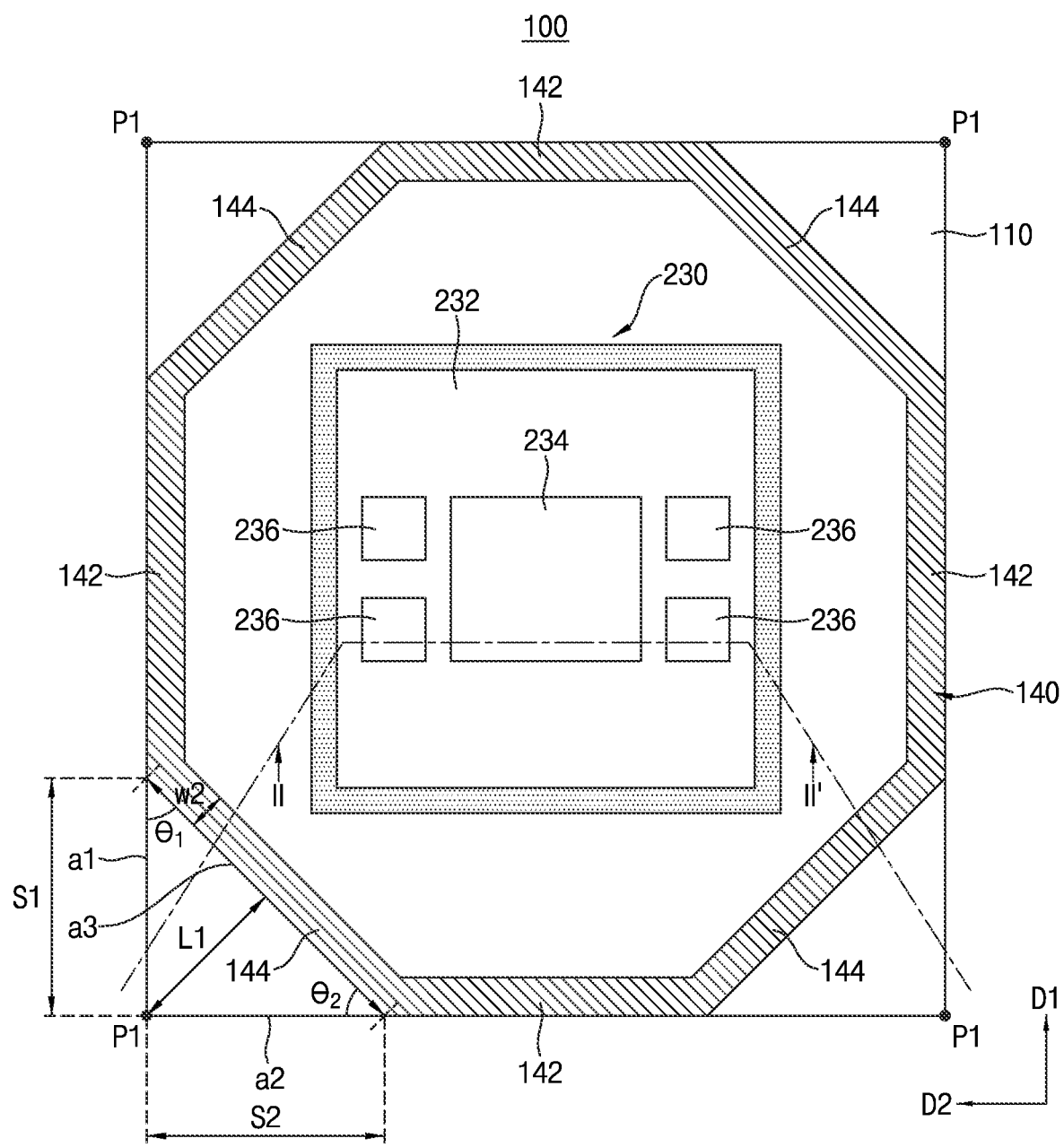

SEMICONDUCTOR PACKAGE WITH STIFFENER

CROSS-REFERENCE TO THE RELATED APPLICATION

This application claims priority under 35 U.S.C. § 119 from Korean Patent Application No. 10-2020-0103278, filed on Aug. 18, 2020, in the Korean Intellectual Property Office, the disclosure of which is incorporated herein by reference in its entirety.

BACKGROUND

1. Field

The exemplary embodiments of the disclosure relate to a semiconductor package with a stiffener.

2. Description of the Related Art

In accordance with demand for high integration and miniaturization of a semiconductor device, such a semiconductor device is being scaled down in size. In addition, semiconductor packages are required to process large volumes of data. To this end, a semiconductor package structure, in which a plurality of semiconductor chips is mounted, is applied.

Meanwhile, in accordance with high integration and high performance of a semiconductor device, excessive heat may be emitted from such a semiconductor device. For this reason, a warpage phenomenon may occur in a semiconductor package. As a result, there may be a problem in that the semiconductor package cannot be mounted on a substrate.

SUMMARY

The exemplary embodiments of the disclosure provide a semiconductor package capable of reducing a warpage phenomenon.

A semiconductor package according to an exemplary embodiment of the disclosure includes a substrate, a semiconductor stack mounted on the substrate, and a stiffener surrounding the semiconductor stack while having an octagonal shape at an edge of an upper surface thereof, and a minimum distance from one angular point of an upper surface of the substrate to the stiffener is determined based on a thickness of the substrate.

A semiconductor package according to an exemplary embodiment of the disclosure includes a substrate, a semiconductor stack mounted on the substrate, and a stiffener surrounding the semiconductor stack, a minimum distance from one angular point of an upper surface of the substrate to the stiffener is 3.5 or more times a thickness of the substrate, and a width of the stiffener is 20% or more of the thickness of the substrate.

A semiconductor package according to an exemplary embodiment of the disclosure includes a substrate, a semiconductor stack mounted on the substrate, a stiffener surrounding the semiconductor stack, a first thermal transfer material provided between the substrate and the stiffener, a heat dissipation plate provided on the stiffener, the heat dissipation plate covering the semiconductor stack, a second thermal transfer material provided between the stiffener and the heat dissipation plate, a heat sink provided on the heat dissipation plate, and a third thermal transfer material provided between the heat dissipation plate and the heat sink, a minimum distance from one angular point of an upper surface of the substrate to the stiffener is 10.5 times a thickness of the substrate, and a width of the stiffener is 20% or more of the thickness of the substrate.

BRIEF DESCRIPTION OF THE DRAWINGS

FIGS. 3 to 5 are plan views of semiconductor packages, according to exemplary embodiments, respectively;

DETAILED DESCRIPTION OF EXEMPLARY EMBODIMENTS

Figure 1:
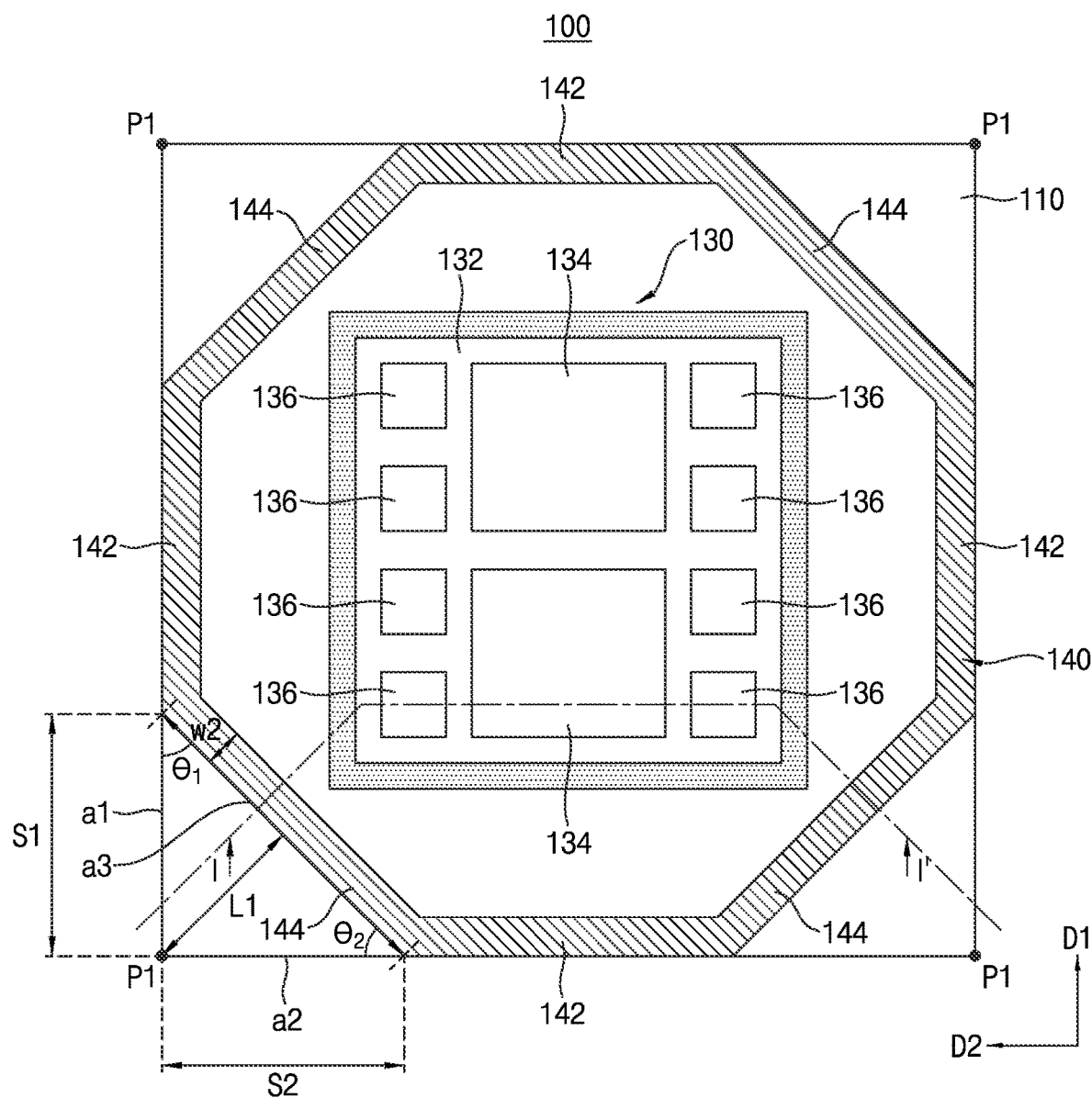
FIG. 1 is a plan view of a semiconductor package, according to an exemplary embodiment.
Figure 2A:
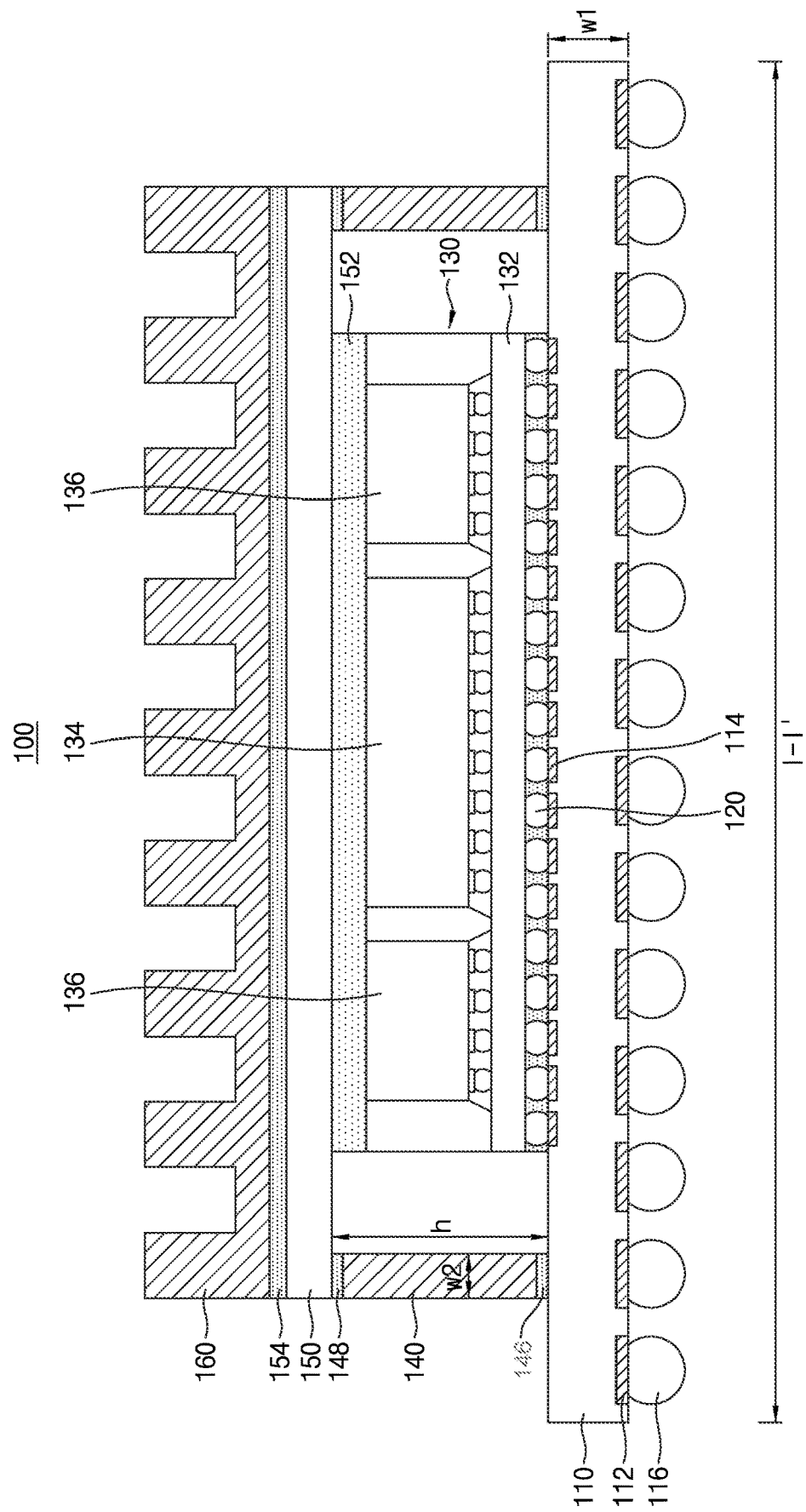
FIGS. 2A and 2B are cross-sectional views taken along line I-I' in the semiconductor package according to the exemplary embodiment shown in FIG. 1.
Figure 2B:
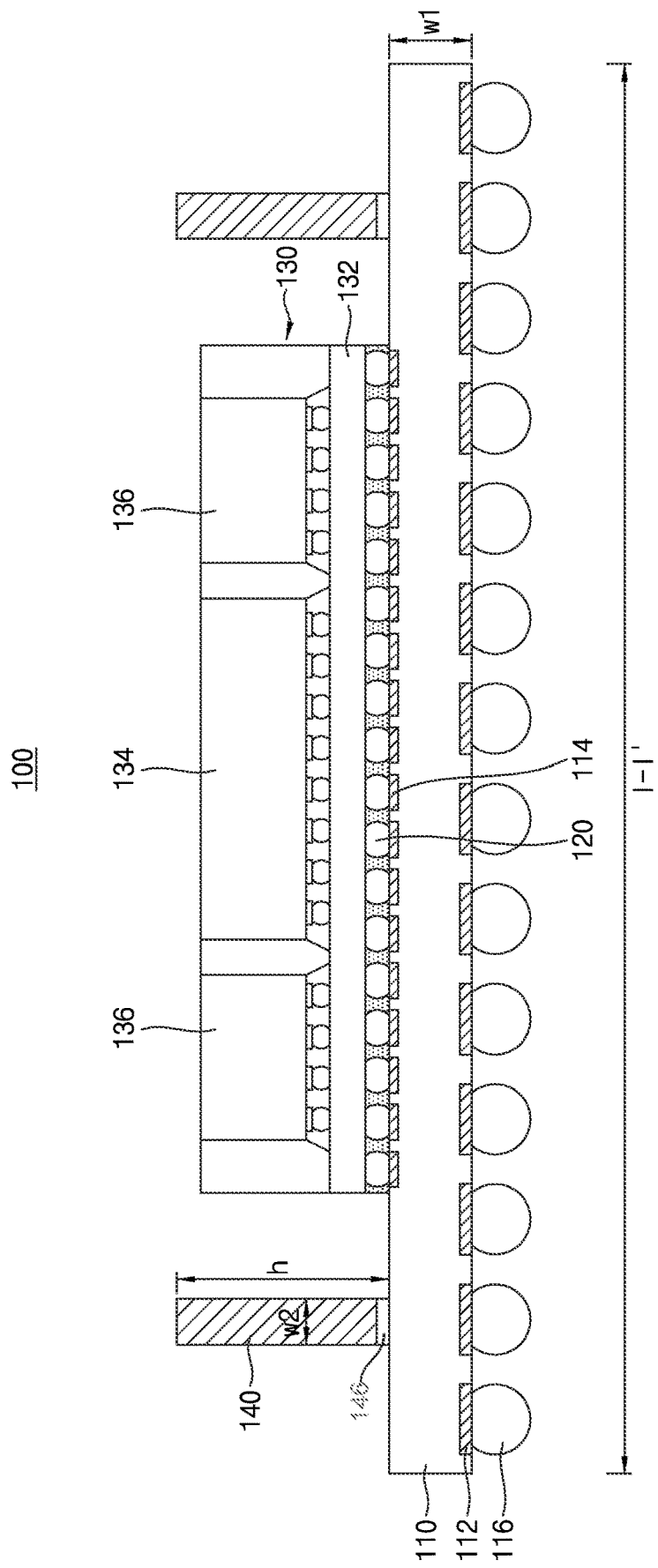

FIG. 1 is a plan view of a semiconductor package, according to an exemplary embodiment of the disclosure. FIGS. 2A and 2B are cross-sectional views taken along line I-I' in the semiconductor package, according to the exemplary embodiment shown in FIG. 1.

Referring to FIGS. 1 and 2A, a semiconductor package 100 may include a substrate 110, substrate connecting terminals 120, a semiconductor stack 130, and a stiffener 140. The substrate 110 may have a quadrangular shape at an edge of an upper surface thereof. For example, the edge of the upper surface of the substrate 110 may have a square shape, as shown in FIG. 1. Alternatively, the edge of the upper surface of the substrate 110 may have a rectangular shape. The substrate 110 may include angular points P1 at the edges of the upper surface thereof. The substrate 110 may include lower pads 112, upper pads 114, and outer connecting terminals 116. In an example embodiment, the substrate 110 may be one of a printed circuit board, a flexible printed circuit board (FPCB), a silicon-based substrate, a ceramic substrate, a glass substrate, and an insulating circuit board.

Each lower pad 112 and each upper pad 114 may be disposed at lower and upper surfaces of the substrate 110, respectively. For example, upper surfaces of the upper pads 114 may be coplanar with an upper surface of the substrate 110, and lower surfaces of the lower pads 112 may be coplanar with a lower surface of the substrate 110. The lower pads 112 may be electrically connected to the upper pads 114. The outer connecting terminals 116 may be disposed at the lower surface of the substrate 110 while being connected to the lower pads 112, respectively. For example, each outer connecting terminal 116 may contact a corresponding one of the lower pads 112. In an example embodiment, the lower pads 112 and the upper pads 114 may include at least one of Al, Ti, Cr, Fe, Co, Ni, Cu, Zn, Pd, Pt, Au, and Ag. Each outer connecting terminal 116 may be a solder ball or a solder bump.

Terms such as "same," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same" or "substantially equal" may be exactly the same or equal, or may be the same or equal within acceptable variations that may occur, for example, due to manufacturing processes. The term "contact," as used herein, refers to a direct connection (i.e., touching) unless the context indicates otherwise.

The substrate connecting terminals 120 may be disposed on the substrate 110. The semiconductor stack 130 may be mounted on the substrate 110 via the substrate connecting terminals 120. Each substrate connecting terminal 120 may contact a corresponding one of the upper pads 114. For example, the substrate connecting terminals 120 may be connected to the upper pads 114, respectively. The substrate connecting terminals 120 may electrically connect the substrate 110 and the semiconductor stack 130. The substrate connecting terminals 120 may include at least one of Sn, In, Bi, Sb, Cu, Ag, Au, Zn, and Pb.

The semiconductor stack 130 may include an interposer 132, first semiconductor chips 134, and second semiconductor chips 136. The interposer 132 may be a silicon (Si) interposer. The interposer 132 may include a through-silicon via therein. For example, the interposer 132 may include a redistribution layer. The redistribution layer may include a conductive redistribution pattern electrically connecting the substrate connecting terminals 120 and the semiconductor chips 134 and 136, and may include an insulating passivation layer covering the redistribution pattern.

The first semiconductor chips 134 and the second semiconductor chips 136 may be disposed on the interposer 132. Two first semiconductor chips 134 may be disposed to be spaced apart from each other in a first horizontal direction D1 by a predetermined distance. Four second semiconductor chips 136 may be disposed around each first semiconductor chip 134. For example, four second semiconductor chips 136 may be disposed at one side of the first semiconductor chips 134 while being aligned with one another in the first horizontal direction D1. Similarly, four second semiconductor chips 136 may be disposed at the other side of the first semiconductor chips 134 while being aligned with one another in the first horizontal direction D1. The second semiconductor chips 136 disposed at one side of the first semiconductor chips 134 and the second semiconductor chips 136 disposed at the other side of the first semiconductor chips 134 may be aligned with each other in a second horizontal direction D2.

Each of the first semiconductor chips 134 may include an application processor (AP) chip such as a microprocessor or a microcontroller, or a logic chip such as a central processing unit (CPU), a graphics processing unit (GPU), a modem, an application-specific integrated circuit (ASIC) or a field programmable gate array (FPGA). Each of the second semiconductor chips 136 may include a volatile memory such as dynamic random access memory (DRAM) or static random access memory (SRAM), or a non-volatile memory such as phase-change random access memory (PRAM), magnetoresistive random access memory (MRAM), ferroelectric random access memory (FeRAM) or resistive random access memory (RRAM).

Although a 2.5D silicon interposer device, in which the first semiconductor chips 134 and the second semiconductor chips 136 are disposed side-by-side on the interposer 132, is illustrated as the semiconductor stack 130 in the exemplary embodiment of the disclosure, this is only illustrative. The semiconductor stack 130 may include any kind of semiconductor requiring packaging such as a single semiconductor chip, a 2.1D semiconductor device, or a 3D semiconductor device.

The stiffener 140 may be disposed on the substrate 110. The stiffener 140 may have an octagonal ring shape surrounding the semiconductor stack 130 when viewed in a top view. That is, the stiffener 140 may have an octagonal shape at an edge of an upper surface thereof. The stiffener 140 may include four first frames 142 extending in parallel with the edge of the substrate 110, and four second frames 144 connecting the four first frames 142 to one another. The first frames 142 and the second frames 144 may be in material continuity with one another. As used herein, the term "material continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures. In an example embodiment, the stiffener 140 may have a regular octagonal ring shape in which the first frames 142 and the second frames 144 have the same length. Outer side walls of the first frames 142 may be disposed to be aligned with the edge of the substrate 110. A length S1 of a first edge a1 extending from one angular point P1 of the substrate 110 to the stiffener 140 in the first horizontal direction D1 may be equal to a length S2 of a second edge a2 extending from the angular point P1 of the substrate 110 to the stiffener 140 in the second horizontal direction D2.

An angle $\theta_1$ formed by an outer side a3 of the second frame 144 of the stiffener 140 disposed adjacent to the angular point P1 of the substrate 110 and the first edge a1 may be equal to an angle $\theta_2$ formed by the outer side a3 of the second frame 144 of the stiffener 140 disposed adjacent to the angular point P1 of the substrate 110 and the second edge a2. At a corner of the upper surface of the substrate 110 corresponding to the angular point P1, an isosceles triangle having an oblique side formed by the outer side a3 of the second frame 144 of the stiffener 140 and two remaining sides formed by the first edge a1 and the second edge a2 may be formed.

A minimum distance L1 from the angular point P1 of the substrate 110 to the stiffener 140 may be determined based on a thickness w1 of the substrate 110. When the upper surface of the stiffener 140 has an octagonal shape, the minimum distance L1 from the angular point P1 of the substrate 110 to the stiffener 140 may be the length of a perpendicular line extending from the angular point P1 of the substrate 110 to the second frame 144 of the stiffener 140 disposed adjacent to the angular point P1 of the substrate 110.

The minimum distance L1 from the angular point P1 of the substrate 110 to the stiffener 140 may be 3.5 or more times the thickness w1 of the substrate 110. In an example embodiment, the minimum distance L1 from the angular point P1 of the substrate 110 to the stiffener 140 may be about 10.5 times the thickness w1 of the substrate 110. When the minimum distance L1 from the angular point P1 of the substrate 110 to the stiffener 140 is 3.5 or more times the thickness w1 of the substrate 110, it may be possible to avoid occurrence of a warpage phenomenon in the semiconductor package 100 caused by lightness, slimness, shortness, and smallness of the semiconductor stack 130. Accordingly, it may be possible to avoid occurrence of a non-wet phenomenon in which the semiconductor package 100 cannot be bonded to a board or a short defect caused by joining of the outer connecting terminals 116 due to melting thereof.

A thickness w2 of the stiffener 140 may be determined based on the thickness w1 of the substrate 110. For example, the thickness w2 of the stiffener 140 may be equal to or more than 20% of the thickness w1 of the substrate 110, but less than 100% of the thickness w1 of the substrate 110. A height h of the stiffener 140 may be determined based on the thickness w1 of the substrate 110. For example, the height h of the stiffener 140 may be equal to or more than the thickness w1 of the substrate 110. The height h of the stiffener 140 may be 100 to 200% of the thickness w1 of the substrate 110. The stiffness of the stiffener 140 may be equal to or more than the stiffness of the substrate 110. For example, the stiffener 140 may include at least one of copper and stainless steel (SAS).

Thickness may refer to the thickness or width measured in a direction parallel to a top surface of the substrate 100. Height may refer to a height or distance measured in a direction perpendicular to the top surface of the substrate 100.

A first thermal transfer material 146 may be provided between the stiffener 140 and the substrate 110. The stiffener 140 may be attached and fixed to the substrate 110 by the first thermal transfer material 146. The first thermal transfer material 146 may contact an upper surface of the substrate 110 and a lower surface of the stiffener 140. The first thermal transfer material 146 may have a thickness that is the same as the thickness W2 of the stiffener 140. The first thermal transfer material 146 may include a thermal interface material (TIM) including polymer, resin, or epoxy together with a filler. The filler may include a dielectric filler such as aluminum oxide, magnesium oxide, aluminum nitride, boron nitride, or diamond powder. The filler may be a metal filler such as silver, copper, aluminum, or the like. The stiffener 140 may receive heat generated in the substrate 110 from the first thermal transfer material 146.

A heat dissipation plate 150 may be provided at an upper surface of the stiffener 140. The heat dissipation plate 150 may include a material having high thermal conductivity. For example, the heat dissipation plate 150 may include at least one of Ag, Cu, Ni, and Au. A second thermal transfer material 148 may be provided between the heat dissipation plate 150 and the stiffener 140. The second thermal transfer material 148 may contact an upper surface of the stiffener 140 and a lower surface of the heat dissipation plate 150. The second thermal transfer material 148 may have a thickness that is the same as the thickness W2 of the stiffener 140. The second thermal transfer material 148 may include a thermal interface material. The heat dissipation plate 150 may be attached and fixed to the stiffener 140 by the second thermal transfer material 148. The heat dissipation plate 150 may receive heat generated in the substrate 110 from the stiffener 140 via the second thermal transfer material 148. The heat dissipation plate 150 may receive heat generated in the semiconductor stack 130 from the stiffener 140 via, the second thermal transfer material 148. A third thermal transfer material 152 may be provided between the heat dissipation plate 150 and the semiconductor stack 130. The third thermal transfer material 152 may contact an upper surface of the semiconductor stack 130 and a lower surface of the heat dissipation plate 150. The third thermal transfer material 152 may include a thermal interface material. The heat dissipation plate 150 may receive heat generated in the semiconductor stack 130 via the third thermal transfer material 152.

A heat sink 160 may be provided at an upper surface of the heat dissipation plate 150. The heat sink 160 may include at least one of a metal-based material, a ceramic-based material, a carbon-based material, and a polymer-based material. A fourth thermal transfer material 154 may be provided between the heat sink 160 and the heat dissipation plate 150. The fourth thermal transfer material 154 may contact an upper surface of the heat dissipation plate 150 and a lower surface of the heat sink 160. The heat sink 160 may receive heat from the heat dissipation plate 150 via the fourth thermal transfer material 154. Heat may include at least one of heat generated in the substrate 110 and heat generated in the semiconductor stack 130. The fourth thermal transfer material 154 may include a thermal interface material. The heat sink 166 may outwardly dissipate heat received via the fourth thermal transfer material 154. The heat sink 166 may include a plurality of grooves more efficiently dissipating heat.

Referring to FIG. 2B, in some embodiments, the semiconductor package 100 may not include the second thermal transfer material 148, the heat dissipation plate 150, the third thermal transfer material 152, the fourth thermal transfer material 154, and the heat sink 160, and, as such, may have a structure in which the semiconductor stack 130 is exposed when viewed in a top view Heat generated in the substrate 110 and heat generated in the semiconductor stack 130 may be outwardly dissipated via the stiffener 140.

Figure 4:
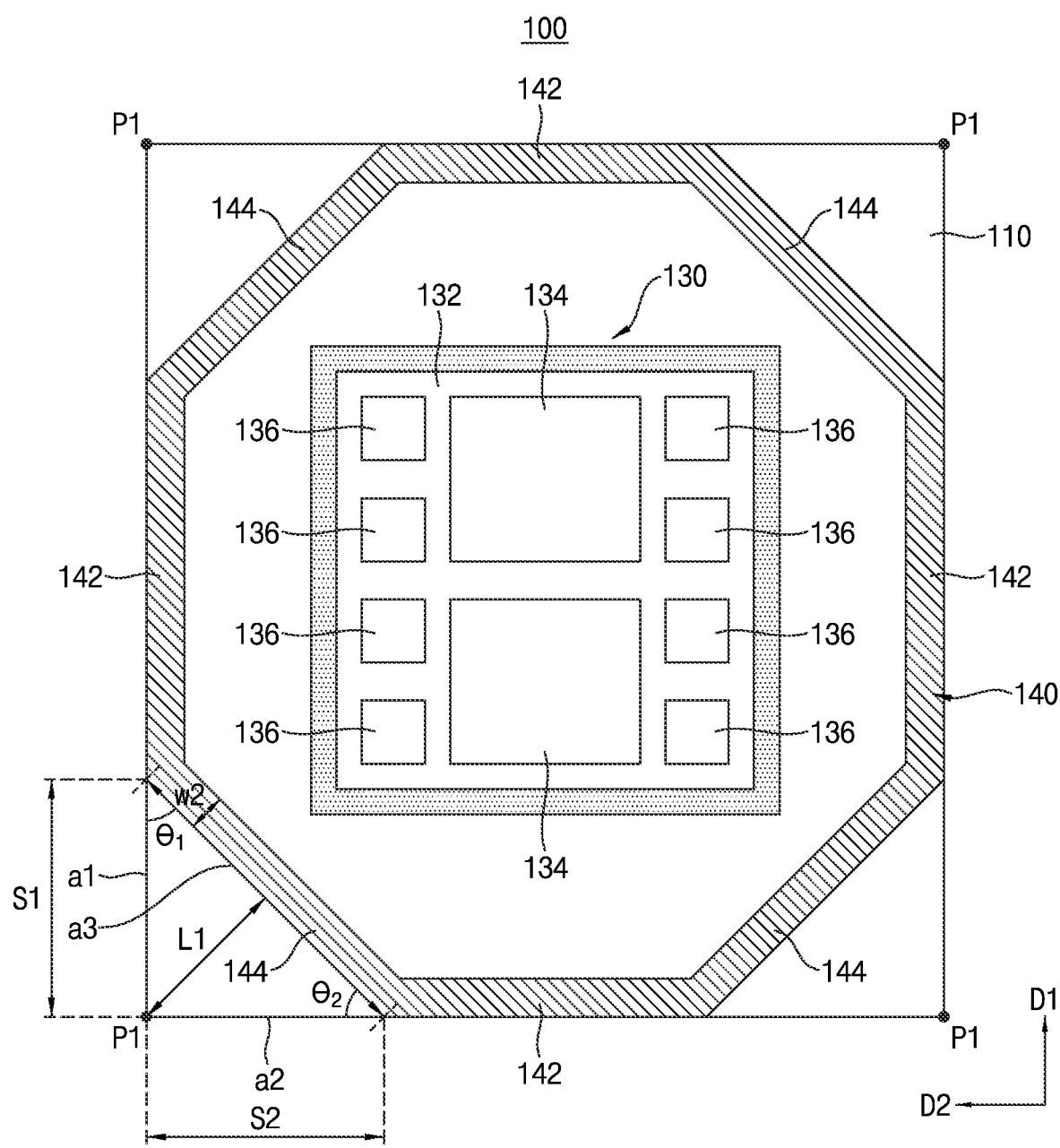
Figure 5:
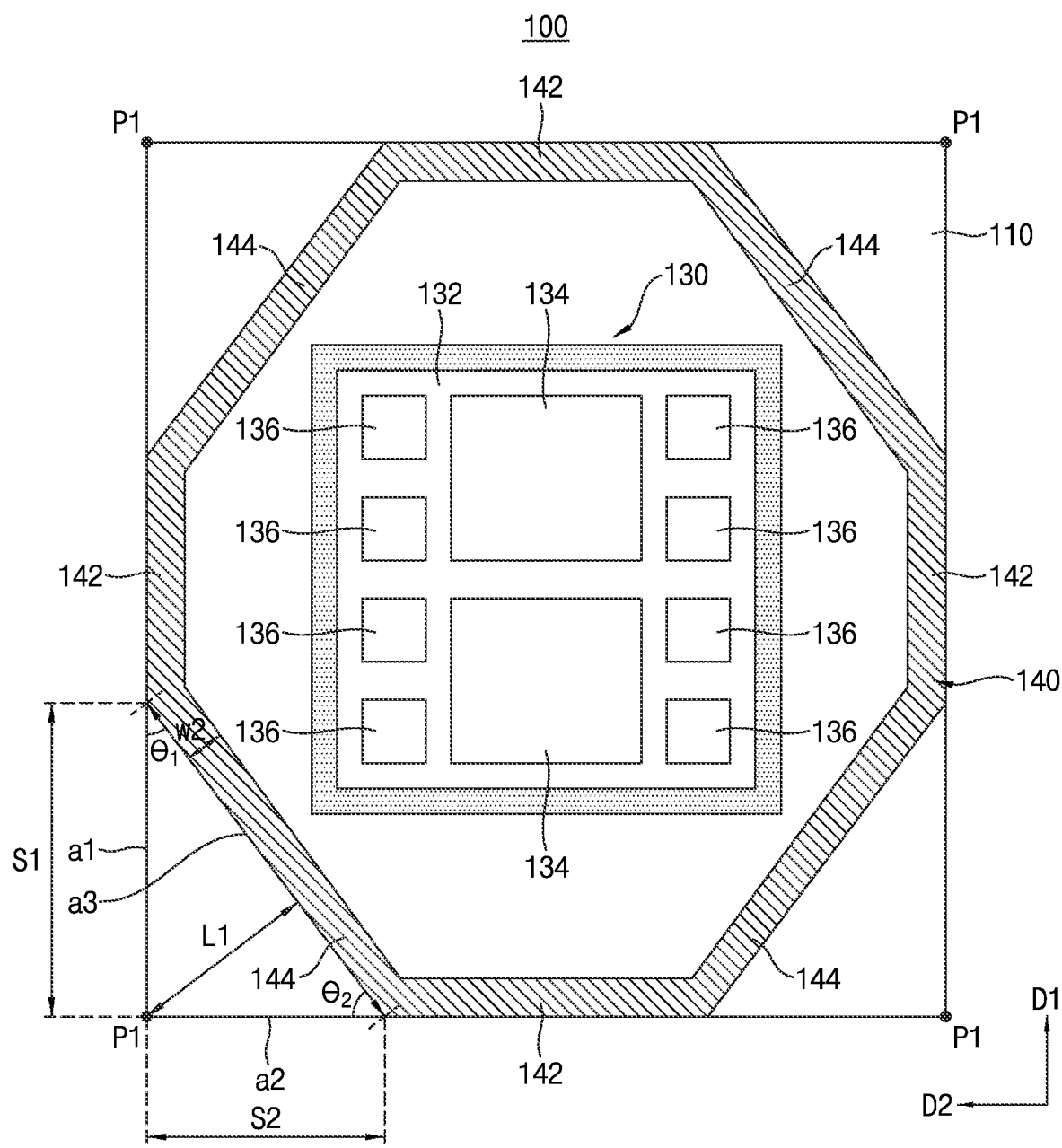

FIGS. 3 to 5 are plan views of semiconductor packages, according to exemplary embodiments of the disclosure, respectively.

Referring to FIG. 3, a semiconductor stack 230 may include an interposer 232, one first semiconductor chip 234 disposed on the interposer 232, and four second semiconductor chips 236 disposed on the interposer 232. The second semiconductor chips 236 may be disposed around the first semiconductor chip 234. For example, the second semiconductor chips 236 may be disposed at opposite sides of the first semiconductor chip 234 while being spaced apart from one another in a first horizontal direction D1 at each side of the first semiconductor chip 234. The interposer 232 may be substantially the same as the interposer 132, the first semiconductor chip 234 may be substantially the same as the first semiconductor chips 134, and the second semiconductor chips 236 may be substantially the same as the second semiconductor chips 136. The cross-sectional view taken along line II-II' in FIG. 3 may be the same as FIG. 2A or FIG. 2B. A minimum distance L1 from one angular point P1 of a substrate 110 to a stiffener 140 may be 3.5 or more times a thickness w1 of the substrate 110. In an embodiment, the minimum distance L1 from the angular point P1 of the substrate 110 to the stiffener 140 may be about 10.5 times the thickness w1 of the substrate 110.

Referring to FIG. 4, first frames 142 extending in a first horizontal direction D1 or a second horizontal direction D2 and second frames 144 connecting the first frames 142 may have different lengths. The second frames 144 may have the same length. Each first frame 142 extending in the first horizontal direction D1 and each first frame 142 extending in the second horizontal direction D2 from among the first frames 142 may have different lengths.

A length S1 of a first edge a1 extending from one angular point P1 of the substrate 110 to the stiffener 140 in the first horizontal direction D1 may be equal to a length S2 of a second edge a2 extending from the angular point P1 of the substrate 110 to the stiffener 140 in the second horizontal direction D2. At a corner of an upper surface of the substrate 110 corresponding to the angular point P1, an isosceles triangle having an oblique side formed by an outer side a3 of the second frame 144 of the stiffener 140 corresponding to the angular point P1 and two remaining sides formed by the first edge a1 and the second edge a2 may be formed.

A minimum distance L1 from the angular point P1 of the substrate 110 to the stiffener 140 may be 3.5 or more times a thickness w1 of the substrate 110. In an embodiment, the minimum distance L1 from the angular point P1 of the substrate 110 to the stiffener 140 may be about 10.5 times the thickness w1 of the substrate 110.

Referring to FIG. 5, in an example embodiment, the length of the second frame 144 may be greater than the length of the first frame 142. The length S1 of the first edge a1 extending from one angular point P1 of the substrate 110 to the stiffener 140 in the first horizontal direction D1 may differ from the length S2 of the second edge a2 extending from the angular point P1 of the substrate 110 to the stiffener 140 in the second horizontal direction D2. A first angle θ1 formed by the outer side a3 of the second frame 144 of the stiffener 140 disposed adjacent to the angular point P1 of the substrate 110 and the first edge a1 may be equal to a second angle θ2 formed by the outer side a3 of the second frame 144 of the stiffener 140 disposed adjacent to the angular point P1 of the substrate 110 and the second edge a2. For example, the first angle θ1 may be 30 to 45°, and the second angle θ2 may be 45 to 60°. At the corner of upper surface of the substrate 110 corresponding to the angular point P1, an isosceles triangle having an oblique side formed by the outer side a3 of the second frame 144 of the stiffener 140 and two remaining sides formed by the first edge a1 and the second edge a2 may be formed.

A minimum distance L1 from the angular point P1 of the substrate 110 to the stiffener 140 may be 3.5 or more times the thickness w1 of the substrate 110. In an example embodiment, the minimum distance L1 from the angular point P1 of the substrate 110 to the stiffener 140 may be about 10.5 times the thickness w1 of the substrate 110.

Figure 6:
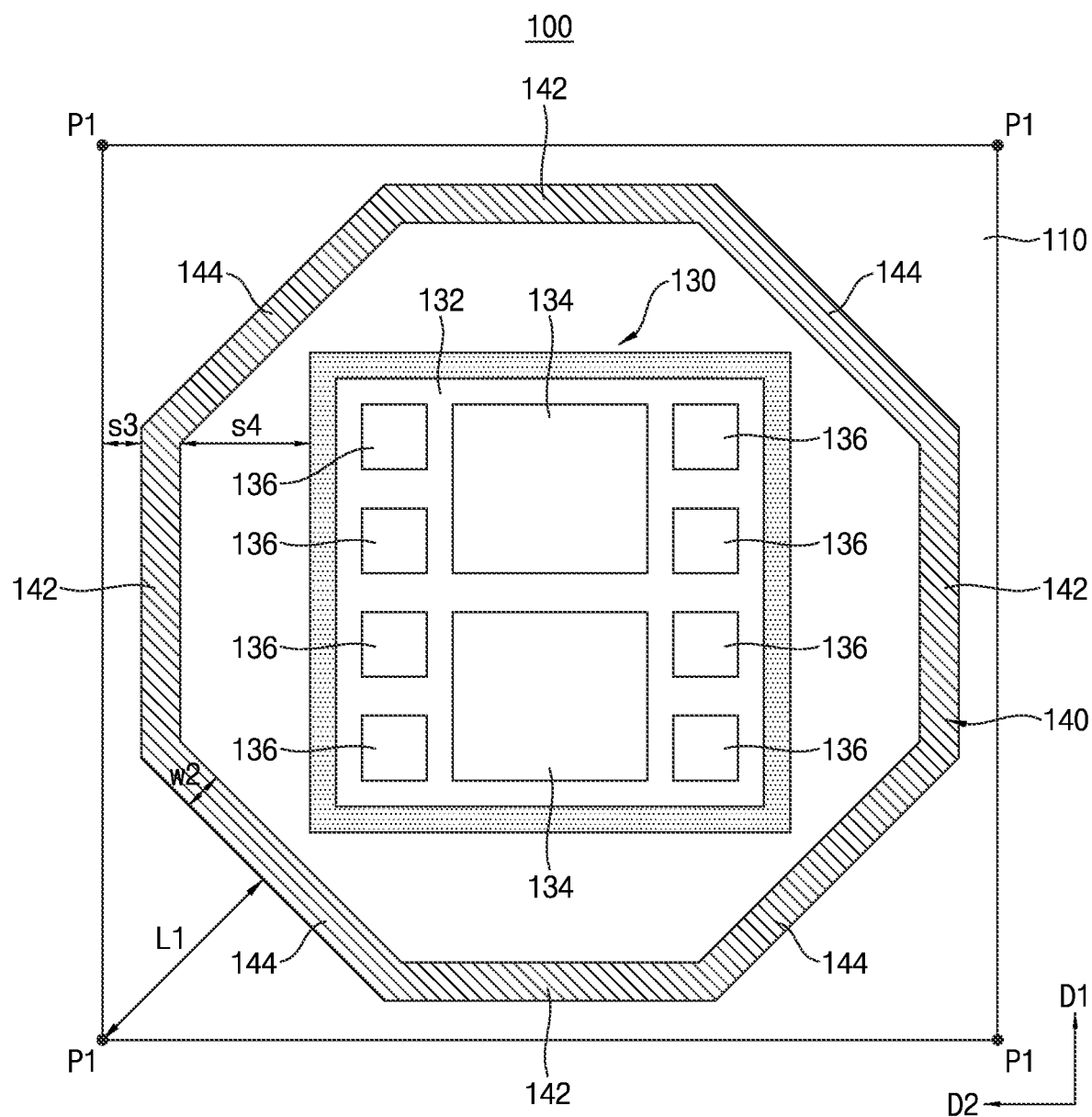
FIGS. 6 to 8 are plan views of semiconductor packages, according to exemplary embodiments.
Figure 7:
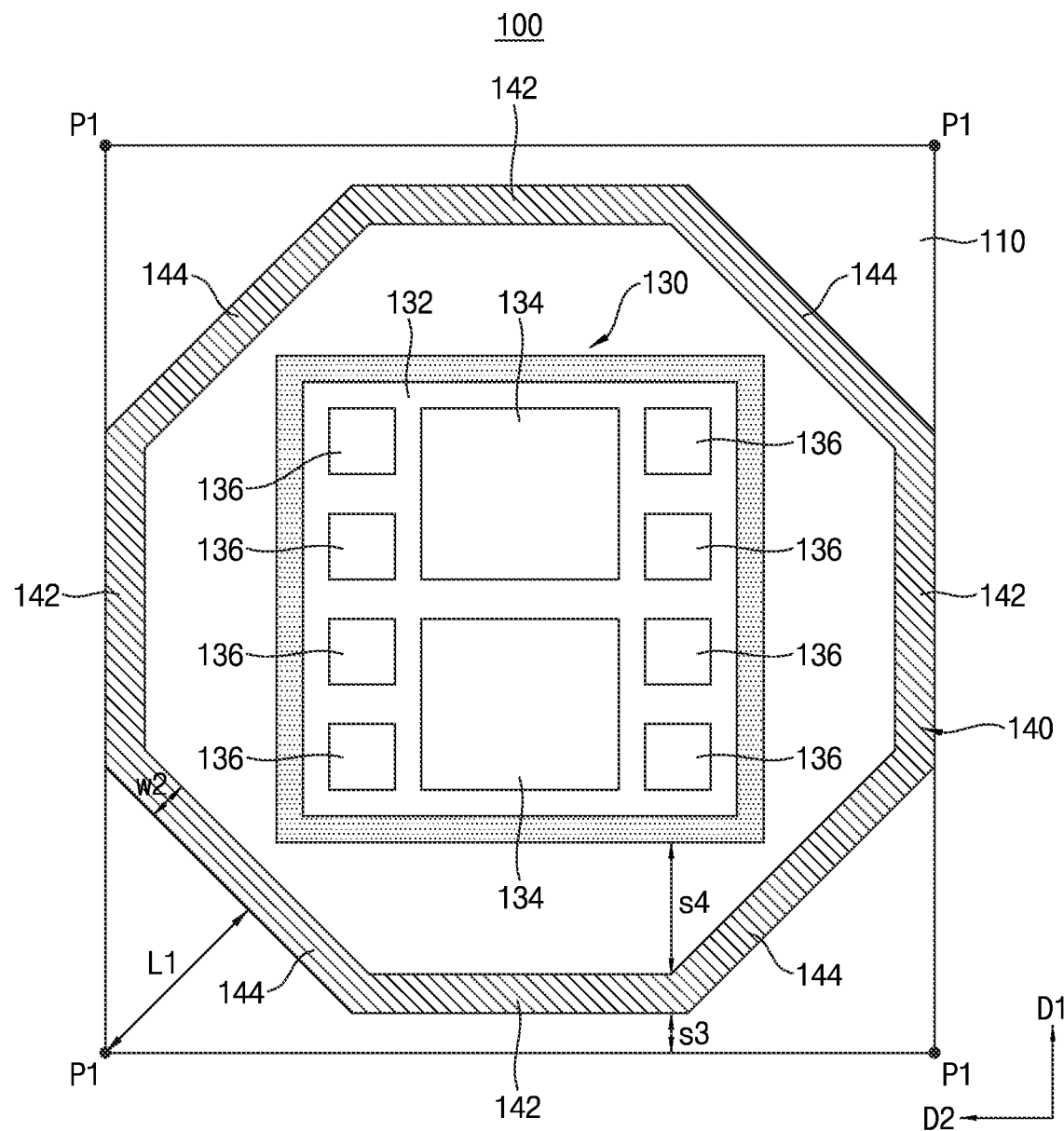
Figure 8:
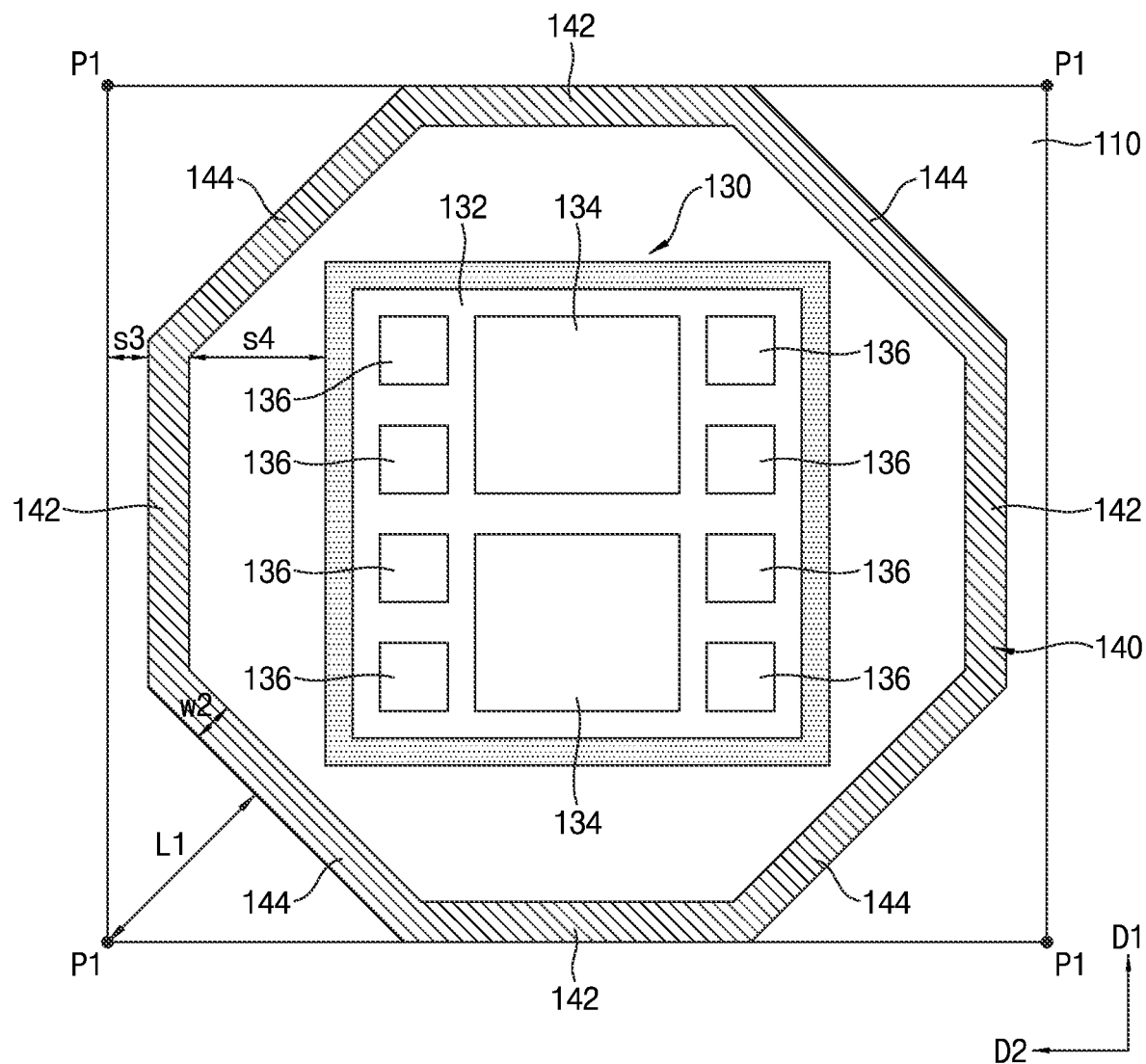

FIGS. 6 to 8 are plan views of semiconductor packages, according to exemplary embodiments of the disclosure.

Referring to FIGS. 6 to 8, when viewed in a top view, at least a part of first frames 142 of a stiffener 144 may be spaced apart from an edge of the substrate 110 in a first horizontal direction D1 and/or a second horizontal direction D2 at outer side walls thereof without being aligned with the edge of the substrate 110 at the outer side walls thereof. A minimum distance S3 from the outer side wall of each first frame 142 not aligned with the edge of the substrate 110 to the edge of the substrate 110 may be smaller than a minimum distance S4 from an inner side wall of the first frame 142 to an outer side wall of a semiconductor stack 130.

FIGS. 9 to 12 are plan views of semiconductor packages, according to exemplary embodiments of the disclosure.

Figure 9:
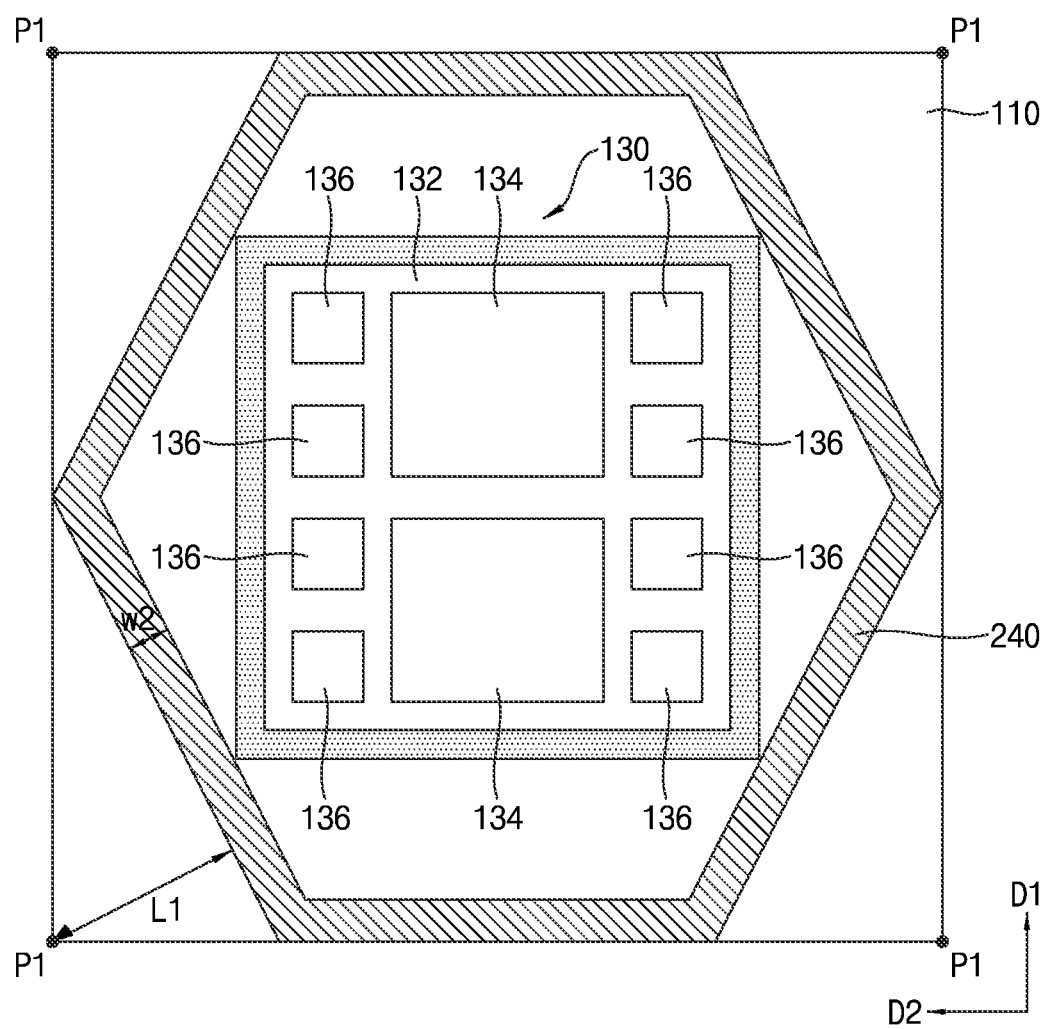
FIGS. 9 to 12 are plan views of semiconductor packages, according to exemplary embodiments.

Referring to FIG. 9, a stiffener 240 may have a hexagonal ring shape at an edge of an upper surface thereof when viewed in a top view. When the edge of the upper surface of the stiffener 240 has a hexagonal shape, a minimum distance L1 from one angular point P1 of a substrate 110 to the stiffener 240 may be the length of a perpendicular line extending from the angular point P1 of the substrate 110 to the edge of the upper surface of the stiffener 240. The minimum distance L1 from the angular point P1 of the substrate 110 to the stiffener 240 may be 3.5 or more times a thickness w1 of the substrate 110. In an example embodiment, the minimum distance L1 from the angular point P1 of the substrate 110 to the stiffener 240 may be about 10.5 times the thickness w1 of the substrate 110. While the stiffener 240 may be different from the stiffener 140 in shape, the stiffener 240 may be substantially the same as the stiffener 140 otherwise.

Figure 10:
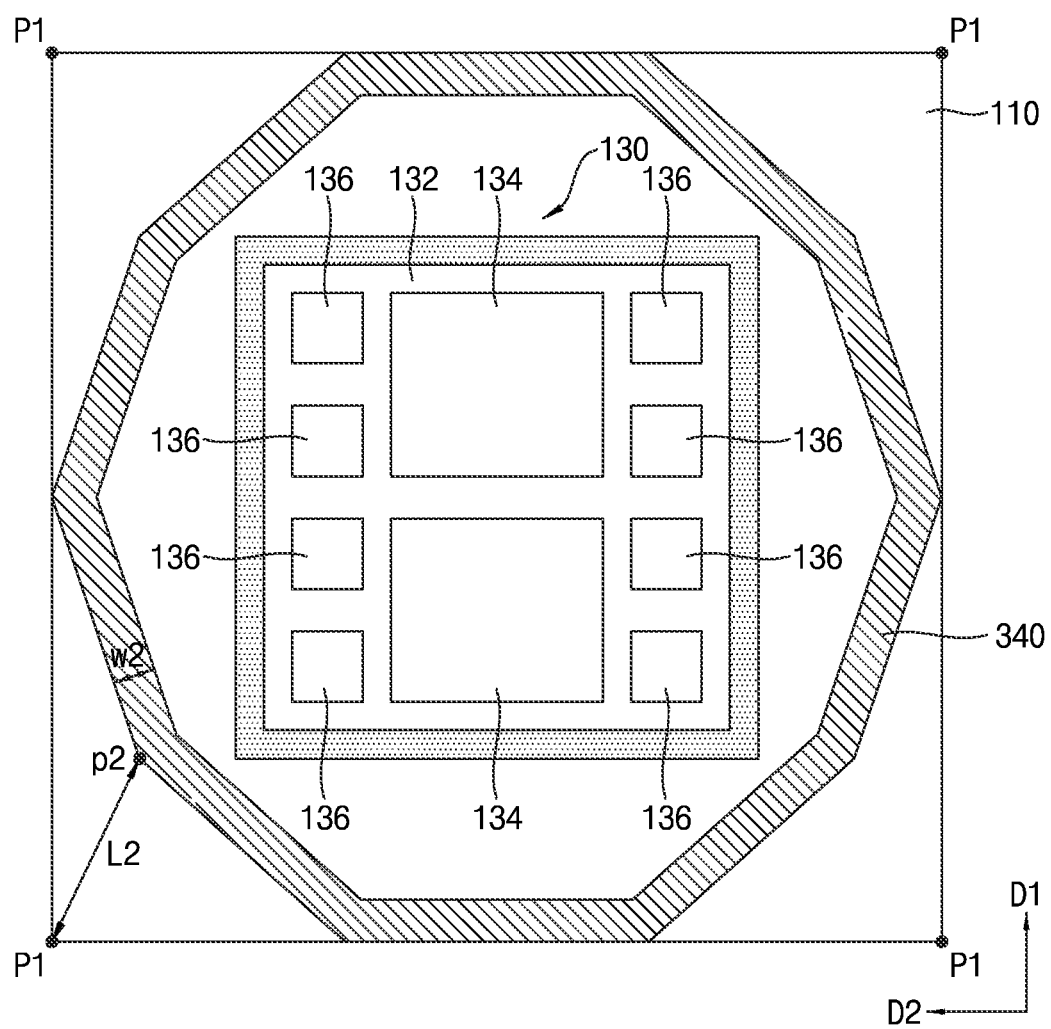

Referring to FIG. 10, a stiffener 340 may have a decagonal ring shape at an edge of an upper surface thereof when viewed in a top view. A minimum distance L2 from one angular point P1 of a substrate 110 to the stiffener 340 may be the length of a straight line extending from the angular point P1 of the substrate 110 to an angular point P2 nearest to the angular point P1 from among angular points P2 of an outer edge of the stiffener 340. The minimum distance L2 from the angular point P1 of the substrate 110 to the stiffener 340 may be 3.5 or more times a thickness w1 of the substrate 110. In an embodiment, the minimum distance L2 from the angular point P1 of the substrate 110 to the stiffener 340 may be about 10.5 times the thickness w1 of the substrate 110. While the stiffener 340 may be different from the stiffener 140 in shape, the stiffener 340 may be substantially the same as the stiffener 140 otherwise.

Figure 11:
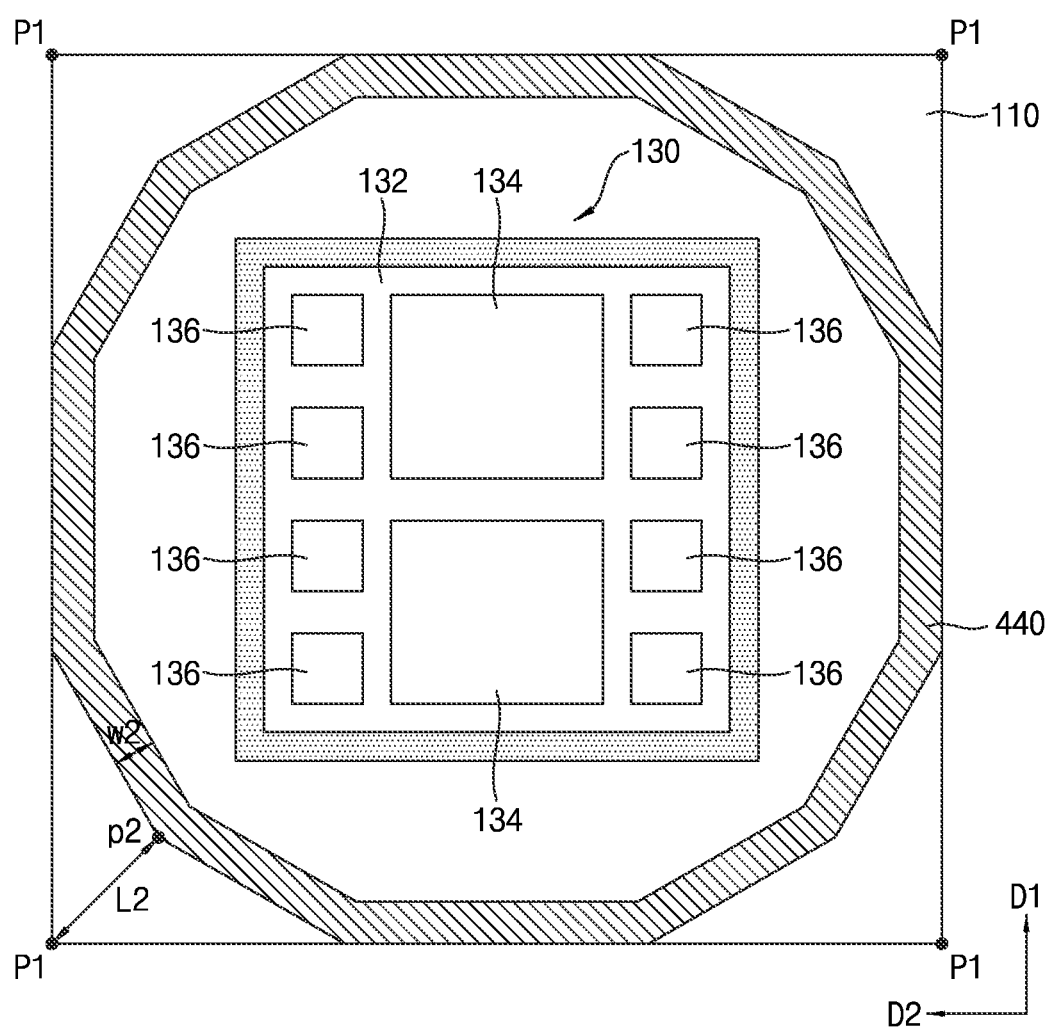

Referring to FIG. 11, a stiffener 440 may have a dodecagonal ring shape at an edge of an upper surface thereof when viewed in a top view. A minimum distance L2 from one angular point P1 of a substrate 110 to the stiffener 440 may be the length of a straight line extending from the angular point P1 of the substrate 110 to an angular point P2 nearest to the angular point P1 from among angular points P2 of an outer edge of the stiffener 440. The minimum distance L2 from the angular point P1 of the substrate 110 to the stiffener 440 may be 3.5 or more times a thickness w1 of the substrate 110. In an embodiment, the minimum distance L2 from the angular point P1 of the substrate 110 to the stiffener 440 may be about 10.5 times the thickness w1 of the substrate 110. While the stiffener 440 may be different from the stiffener 140 in shape, the stiffener 440 may be substantially the same as the stiffener 140 otherwise.

Figure 12:
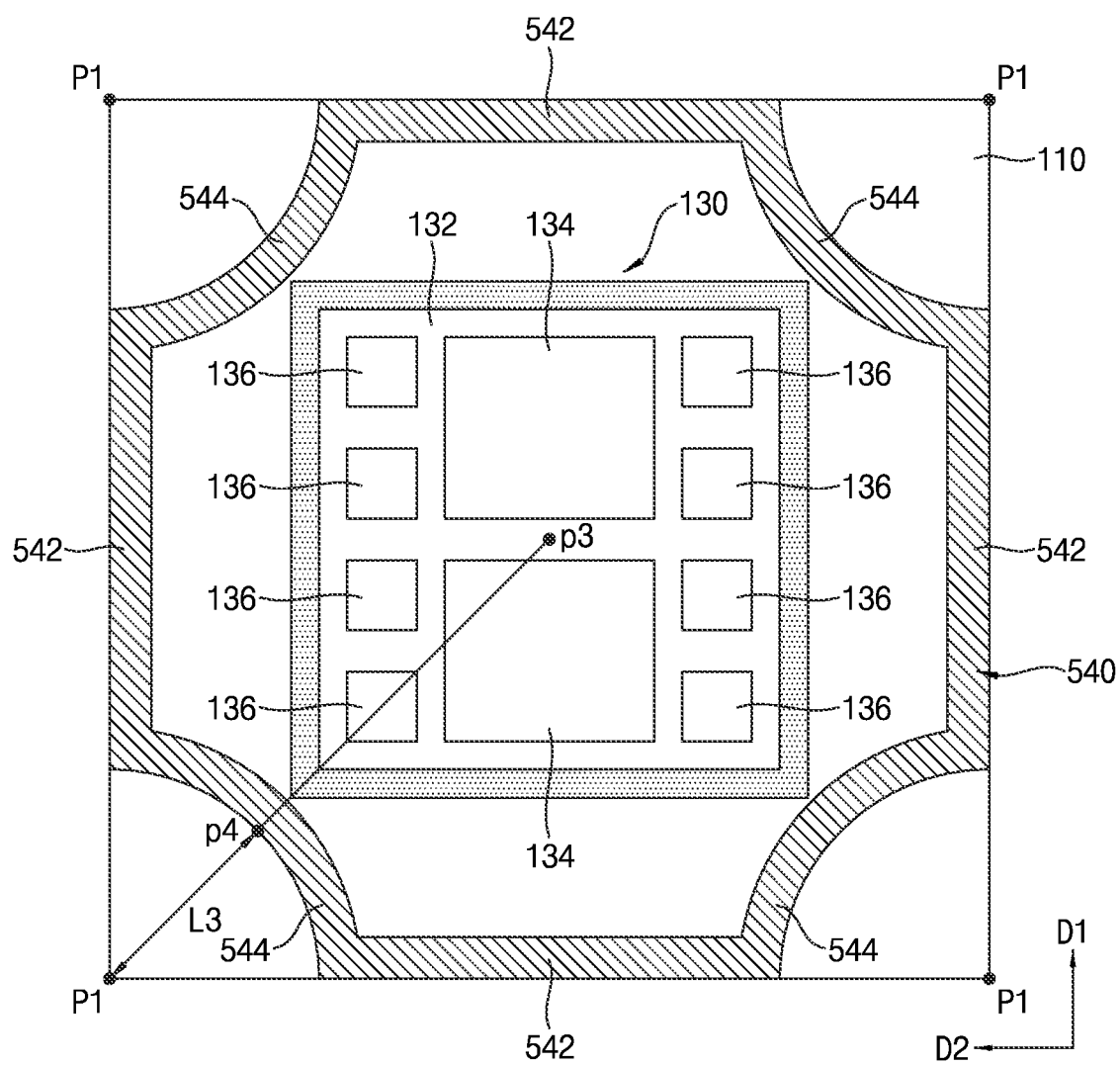

Referring to FIG. 12, a stiffener 540 may include first frames 542 extending along an edge of a substrate 110, and second frames 544 connecting the first frames 542 to one another. Each second frame 544 may have a shape convex with respect to an angular point P1 of an upper surface of the substrate 110 corresponding to the second frame 544 and concave with respect to a center P3 of an upper surface of a semiconductor stack 130.

A minimum distance L3 from the angular point P1 of the substrate 110 to the stiffener 540 may be the length of a straight line connecting the angular point P1 of the substrate 110 and a point P4, at which a straight line extending from the angular point P1 of the substrate 110 toward the center P3 of the semiconductor stack 130 and an outer edge of the stiffener 540 meet. The minimum distance L3 from the angular point P1 of the substrate 110 to the stiffener 540 may be 3.5 or more times a thickness w1 of the substrate 110. In an embodiment, the minimum distance L3 from the angular point P1 of the substrate 110 to the stiffener 540 may be about 10.5 times the thickness w1 of the substrate 110. While the stiffener 540 may be different from the stiffener 140 in shape, the stiffener 540 may be substantially the same as the stiffener 140 otherwise.

In accordance with exemplary embodiments of the disclosure, one angular point of an upper surface of a substrate is spaced apart from a stiffener and, as such, it may be possible to reduce occurrence of a warpage phenomenon of a semiconductor package caused by a process carried out at a high temperature and occurrence of a non-wet phenomenon when the semiconductor package is mounted on the substrate.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
   a substrate having
      first sides opposing each other,
      and second sides opposing each other and intersecting the first sides;
   a semiconductor stack mounted on the substrate, wherein the semiconductor stack defines a stack area having first edges parallel to the first sides and second edges parallel to the second sides; and
   a stiffener including a plurality of frames surrounding the stack area on the substrate, wherein the plurality of the frames of the stiffener includes
      first frames disposed adjacent the first sides of the substrate, spaced a first distance from the first edges of the stack area, and surrounding at least a portion of the first edges,
      second frames disposed adjacent the second sides of the substrate, spaced a second distance from the second edges of the stack area, and surrounding at least a portion of the second edges, and
      third frames connecting the first frames and the second frames to each other,
   wherein, in plan view, the plurality of the frames of the stiffener have an octagonal shape,
   wherein the first frames are spaced apart from the first sides of the substrate or the second frames are spaced apart from the second sides of the substrate, and
   wherein a closest distance from (i) an intersection point between the first sides and the second sides at an outer corner of the substrate and at an upper surface of the substrate to (ii) an outer side of the third frames of the stiffener is at least 3.5 times a thickness of the substrate, wherein the thickness of the substrate is measured in a vertical direction perpendicular to the upper surface of the substrate,
   wherein a width of the plurality of the frames of the stiffener is at least 20% the thickness of the substrate and less than the thickness of the substrate, wherein the width of the plurality of the frames is measured in a lateral direction parallel to the upper surface of the substrate, and
   wherein the intersection point is laterally outside the plurality of frames.

2. The semiconductor package according to claim 1, wherein the closest distance is 10.5 times the thickness of the substrate.

3. The semiconductor package according to claim 1, wherein the first frames are aligned with the first sides of the substrate.

4. The semiconductor package according to claim 1, wherein a stiffness of the stiffener is equal to or more than a stiffness of the substrate.

5. The semiconductor package according to claim 1, wherein the stiffener has a height equal to 100% to 200% of the thickness of the substrate.

6. The semiconductor package according to claim 1, wherein an outer side wall of the first frames of the stiffener is spaced apart from the first sides of the substrate by a third distance less than the first distance, and an outer side wall of the second frames of the stiffener is spaced apart from the second sides of the substrate by a fourth distance less than the second distance when viewed in a top view.

7. The semiconductor package according to claim 1, wherein the closest distance is a length of a line extending from the intersection point to the outer side of the third frames of the stiffener, wherein the line is perpendicular to the outer side of the third frames of the stiffener.

8. The semiconductor package according to claim 1, further comprising:
   a first thermal transfer material provided between the substrate and the stiffener.

9. The semiconductor package according to claim 1, further comprising:
   a heat dissipation plate provided on the stiffener, the heat dissipation plate covering the semiconductor stack.

10. A semiconductor package comprising:
   a substrate having
      first sides opposing each other, and
      second sides opposing each other and intersecting the first sides;
   a semiconductor stack mounted on the substrate, wherein the semiconductor stack defines a stack area having first edges parallel to the first sides and second edges parallel to the second sides; and
   a stiffener including a plurality of frames surrounding the stack area on the substrate,
   wherein a closest distance from (i) an intersection point between the first sides and the second sides at an outer corner of the substrate and at an upper surface of the substrate to (ii) an outer side of the stiffener is greater than a width of the plurality of the frames of the stiffener,
   wherein the closest distance is at least 3.5 times a thickness of the substrate, wherein the thickness of the substrate is measured in a vertical direction perpendicular to the upper surface of the substrate,
   wherein the width of the plurality of the frames of the stiffener is at least 20% the thickness of the substrate and less than the thickness of the substrate, wherein the width of the plurality of the frames is measured in a lateral direction parallel to the upper surface of the substrate, and
   wherein the intersection point is laterally outside the plurality of frames.

11. The semiconductor package according to claim 10, wherein a shape formed by the plurality of frames comprises, in plan view, any one of a hexagonal shape, a decagonal shape, and a dodecagonal shape.

12. The semiconductor package according to claim 10, wherein the plurality of the frames of the stiffener comprises:
   first frames extending along the first sides of the substrate, spaced apart from the first edges of the stack area, and surrounding at least a portion of the first edges;
   third frames extending along second sides of the substrate, spaced apart from the second edges of the stack area, and surrounding at least a portion of the second edges; and
   second frames connecting the first frames and the third frames to each other, and
   wherein each of the second frames has a shape convex with respect to the intersection point.

13. The semiconductor package according to claim 10, wherein the plurality of the frames of the stiffener are spaced apart from the first sides and the second sides of the substrate when viewed in a top view.

14. The semiconductor package according to claim 10, wherein the closest distance is a length of a line extending from the intersection point to an outer side of frames located adjacent to the intersection point among the plurality of the frames of the stiffener, wherein the line is perpendicular to the outer side of the frames.

15. A semiconductor package comprising:
  a substrate having
    first sides opposing each other, and
    second sides opposing each other and intersecting the first sides;
  a semiconductor stack mounted on the substrate, wherein the semiconductor stack defines a stack area having first edges parallel to the first sides and second edges parallel to the second sides;
  a stiffener including a plurality of frames spaced apart from the first sides and the second sides of the substrate and surrounding the stack area on the substrate;
  a first thermal transfer material provided between the substrate and the stiffener;
  a heat dissipation plate provided on the stiffener, the heat dissipation plate covering the semiconductor stack;
  a second thermal transfer material provided between the stiffener and the heat dissipation plate;
  a heat sink provided on the heat dissipation plate; and
  a third thermal transfer material provided between the heat dissipation plate and the heat sink,
  wherein a closest distance from (i) an intersection point between the first sides and the second sides at an outer corner of the substrate and at an upper surface of the substrate to (ii) an outer side of the stiffener is greater than a width of the plurality of the frames of the stiffener,
  wherein the closest distance is at least 3.5 times a thickness of the substrate, wherein the thickness of the substrate is measured in a vertical direction perpendicular to the upper surface of the substrate,
  wherein the width of the plurality of the frames of the stiffener is at least 20% the thickness of the substrate and less than the thickness of the substrate, wherein the width of the plurality of the frames is measured in a lateral direction parallel to the upper surface of the substrate, and
  wherein the intersection point is laterally outside the plurality of frames.

16. The semiconductor package according to claim 15, wherein a shape formed by the plurality of frames comprises an octagonal shape.

17. The semiconductor package according to claim 15, wherein the closest distance is a length of a line extending from the intersection point to an outer side of frames located adjacent to intersection point among the plurality of the frames of the stiffener, wherein the line is perpendicular to the outer side of the frames.

18. The semiconductor package according to claim 15, wherein a height of the plurality of the frames of the stiffener is 100% to 200% of the thickness of the substrate.

* * * * *